(12) United States Patent
Weigert et al.

(10) Patent No.: US 6,922,424 B2
(45) Date of Patent: Jul. 26, 2005

(54) LASER DEVICE

(75) Inventors: Martin Weigert, Berlin (DE); Gunther Steinle, München (DE); Hans-Dietrich Wolf, Hohenbrunn (DE); Hans-Ludwig Althaus, Lappersdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/339,245

(22) Filed: Jan. 9, 2003

(65) Prior Publication Data

US 2003/0138009 A1 Jul. 24, 2003

(30) Foreign Application Priority Data

Jan. 9, 2002 (DE) .......................... 102 01 102

(51) Int. Cl.⁷ .............................. H01S 5/00; H01S 3/13; H01S 3/08
(52) U.S. Cl. .................. 372/43; 372/29.02; 372/108
(58) Field of Search ................. 372/36, 43, 29.02, 372/108, 29, 50, 96; 385/88, 49; 438/708, 47; 356/237.1

(56) References Cited

U.S. PATENT DOCUMENTS

| | | | | |
|---|---|---|---|---|
| 5,130,531 A | * | 7/1992 | Ito et al. ............... | 250/216 |
| 5,500,869 A | * | 3/1996 | Yoshida et al. ......... | 372/50 |
| 5,555,334 A | | 9/1996 | Ohnishi et al. | |
| 5,577,064 A | * | 11/1996 | Swirhun et al. ......... | 372/96 |
| 5,606,572 A | * | 2/1997 | Swirhun et al. ......... | 372/96 |
| 5,787,215 A | * | 7/1998 | Kuhara et al. ........... | 385/88 |
| 5,837,561 A | * | 11/1998 | Kish et al. .............. | 438/47 |
| 5,925,898 A | | 7/1999 | Spath | |
| 5,943,357 A | * | 8/1999 | Lebby et al. ............. | 372/50 |
| 6,072,607 A | * | 6/2000 | Tajiri et al. .............. | 359/15 |
| 6,374,021 B1 | * | 4/2002 | Nakanishi et al. ........ | 385/49 |
| 2002/0196431 A1 | * | 12/2002 | DeFelice et al. ......... | 356/237.1 |
| 2003/0109142 A1 | * | 6/2003 | Cable et al. ............. | 438/708 |
| 2004/0105627 A1 | * | 6/2004 | Hargis et al. ............ | 385/88 |
| 2004/0136658 A1 | * | 7/2004 | Kropp ...................... | 385/88 |

FOREIGN PATENT DOCUMENTS

| | | |
|---|---|---|
| DE | 195 27 026 C2 | 2/1997 |
| DE | 199 35 496 C1 | 1/2001 |
| WO | WO 95/26051 | 9/1995 |

* cited by examiner

*Primary Examiner*—Thuy Vinh Tran
*Assistant Examiner*—Hung Tran Vy
(74) *Attorney, Agent, or Firm*—Laurence A. Greenberg; Werner H. Stemer; Gregory L. Mayback

(57) ABSTRACT

A laser device has a laser diode with an optical resonator. The resonator has an exit side for emitting light into an optical system. A monitor diode is provided and has a light-sensitive face for measuring optical quantities of the laser diode. The light-sensitive face of the monitor diode is optically coupled to a backside of the laser diode, on the other side from the light exit side of the resonator, the backside also emitting light. This configuration permits a space-saving SMD layout for the laser device.

20 Claims, 2 Drawing Sheets

LASER DEVICE

BACKGROUND OF THE INVENTION

Field of the Invention

The invention relates to a laser device having a laser diode with an optical resonator for emitting light into an optical system and a monitor diode with a light-sensitive face for measuring optical quantities of the laser diode.

A conventional laser device has a laser diode and a monitor diode. The monitor diode senses a part, at least a small fraction, of the light generated by the laser diode, in order, for example, to lock the laser diode onto a predetermined working point, to fulfill safety functions, especially in the event of excessive radiation power, to detect aging of the laser diode and to permit regulation.

The monitor diode can be a photodiode integrated in a silicon chip and is fastened directly on a base plate. In order to evaluate a measurement signal correlated with sensed laser light, the monitor diode is connected by bonding wires to terminal pins of the laser device. A vertically emitting laser diode is soldered for fastening on the monitor diode, the laser diode also being bonded by the bonding wire to the terminal pins of the laser device.

Light emitted by the laser diode enters an optical system, for example through a window or lens system of the laser device. The lens system is, for example, connected to an optical fiber or another optical or optoelectronic element of the optical system. A part of the light emitted by the laser diode is reflected or back-scattered from the window or lens system and sent onto the monitor diode. The majority of the emitted light, however, is coupled into the optical system, for example into an optical fiber. In order to prevent interference with the beam path and to protect the components (for example against moisture and mechanical stresses), the laser device has a hermetically sealed package.

SUMMARY OF THE INVENTION

It is accordingly an object of the invention to provide a laser device that overcomes the above-mentioned disadvantages of the prior art devices of this general type, which has a simplified configuration, without thereby necessitating increased spatial dimensions.

With the foregoing and other objects in view there is provided, in accordance with the invention, a laser device. The laser device contains an optical system, a laser diode having a backside and an optical resonator with an exit side for emitting light into the optical system, and a monitor diode having a light-sensitive face for measuring at least one optical quantity of the laser diode. The light-sensitive face is optically coupled to the backside of the laser diode. The backside is opposite the exit side of the resonator and also emits further light.

Accordingly, a light-sensitive face of the monitor diode is optically coupled to one side of the laser diode. The optical coupling permits an optical active relationship between the light generated by the laser diode and the light measured in the monitor diode. In addition to, in particular, varying optical characteristics of the laser diode, the monitor diode or a further integrated component may be used for sensing further parameters, for example the temperature.

The laser diode is disposed between the optical system receiving the laser light and the monitor diode, so that the light-sensitive face of the monitor diode is optically coupled to backside of the laser diode on the other side from the exit side of the resonator assigned with the optical system. For coupling to the monitor diode, the backside of the laser diode also emits light that has an active relationship with the light emitted into the optical system, for example being a fraction thereof.

The laser device according to the invention has at least one laser diode with an optical resonator and a monitor diode with an optically active face for measuring optical quantities of the laser diode. The resonator consists, for example, of so-called Bragg reflectors, which, according to their configuration, act essentially reflectively but can also transmit or absorb a part of the light. Extraction of a part of the light from the exit side of the laser diode, for the purpose of sensing by a monitor diode, is not necessary.

In an advantageous configuration of the invention; the backside of the laser diode is directly next to the monitor diode. Direct proximity permits straightforward assembly, and even pre-assembly of a unit made up of a laser diode and a monitor diode. As an alternative to the configuration, an optical system, in the simplest case a transparent plastic, is provided between the backside of the laser diode and the monitor diode. This may be advantageous if couplings other than of the optical type are intended to be reduced between the laser diode and the monitor diode. These other couplings are, for example, thermal or electrical couplings, which can lead to falsification of the measurement signals sensed by the monitor diode.

In order to improve an optical relationship between the laser diode and the monitor diode, in a further advantageous configuration, the laser diode has optical reflectors. The reflector assigned to the backside of the laser diode for optical coupling to the monitor diode is configured so that the reflector transmits a part of the laser light which can be sensed by the monitor diode. For example, the number of individual reflectors of a Bragg reflector is reduced, or some of the reflectors are modified in terms of their reflection characteristic. Advantageously, for transmission, the reflector has a subregion with a reduced reflectance, which is positioned with respect to the light-sensitive face of the monitor diode. Such extraction from the laser diode can be produced with greater process reliability than coupling via reflections of an optical system, as are provided in the prior art.

In an advantageous version of the invention, the backside of the laser diode facing the monitor diode has an increased reflectance. To that end, for example, the surface of the backside is roughened. This reduces back-reflections from the monitor diode into the laser diode, which is detrimental to the operation of the laser diode.

The terminals of the monitor diode are preferably disposed at the heavily doped position of the substrate of the monitor diode, so that they are preferably disposed on the same side as where the incorporation of the donors and acceptors for the light-sensitive face of the monitor diode takes place. In a refinement of the invention, a face of the monitor diode facing away from the laser diode is structured for electrical contacting. A prerequisite for such a configuration is that the substrate of the monitor diode does not substantially absorb the wavelength of the laser light of the laser diode. This low absorption permits optical coupling through the substrate of the monitor diode.

According to a further refinement of the invention, a side of the laser diode facing away from the monitor diode is structured for electrical contacting, so that the optical coupling between the laser diode and the monitor diode is independent of the electrical contacting and the mechanical fastening of the laser diode. Advantageously, the laser diode is fastened directly on a substrate.

According to an advantageous configuration of the invention, the laser diode is fastened with the exit side on the substrate, so that the substrate is in an optical active relationship with the beam path of the laser light. Advantageously, an optical system is integrated in the substrate. It may, as an optical subsystem, be part of a transmission section of the beam path and, for example, be used for coupling into an optical fiber.

In an advantageous configuration of the invention, for simplified and automatable assembly, the light-emitting side of the laser diode is structured. The laser diode is in this case contacted and fastened on the substrate using flip chip technology by means of soldering.

Advantageously, the laser diode can be positioned with respect to the optical system independently of the configuration of the backside monitor diode. The positioning independence is achieved by functional separation of the light exit on the exit side of the laser diode and the detection of the monitor light.

As an alternative to the aforementioned cases of fastening a separate monitor diode on a separate laser diode, in an alternative refinement of the invention, the monitor diode is monolithically integrated in the backside of the laser diode. It is, for example, part of a partially reflecting and partially absorbing reflector unit of a Bragg reflector.

In a preferred configuration of the invention, a region provided between the resonator and the substrate is filled with a transparent plastic. It is also possible to provide a transparent plastic between the resonator and the monitor diode.

The configuration is preferably potted or encapsulated with a nontransparent plastic that protects the individual components and increases the mechanical stability of the device.

The laser diode is preferably mounted on a substrate using flip chip technology in the upside down layout, the substrate being a submount which is transparent for the emission wavelength of the laser diode. The substrate is formed, for example, of silicon or SiC. A nontransparent plastic in this case preferably fully encases the laser diode, the monitor diode and the substrate, except for a light exit window. The light exit window is preferably formed by a subregion of the substrate, in particular by the external surface of a beam-shaping face integrated in the substrate, for instance the external surface of a lens.

The substrate is preferably disposed on a lead frame, the lead frame having an opening in the vicinity of the light exit window. The nontransparent plastic may also jointly enclose the lead frame at least partly.

Furthermore, a housing may be provided which is filled with the nontransparent plastic and which encloses at least the laser diode, the monitor diode and the substrate, except for the light exit side. The housing is for example a plastic package.

The laser diode is preferably a vertically emitting laser diode (VCSEL). The monitor diode is disposed on the backside of the VCSEL laser diode.

Other features which are considered as characteristic for the invention are set forth in the appended claims.

Although the invention is illustrated and described herein as embodied in a laser device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
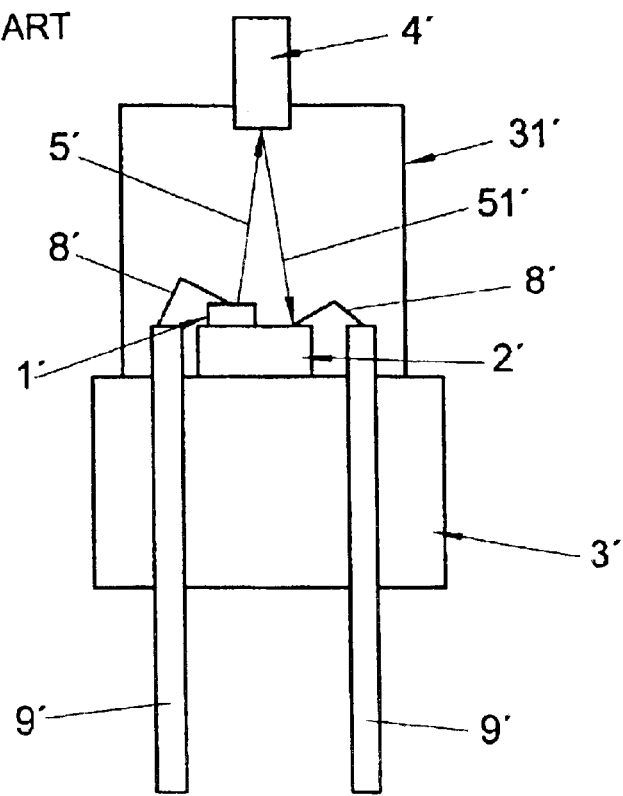
FIG. 3 is a sectional view of a laser device known in the prior art.

Referring now to the figures of the drawing in detail and first, particularly, to FIG. 3 thereof, there is shown a prior art laser device. A monitor diode is in this case a photodiode 2' and is integrated in a silicon chip and is fastened directly on a base plate 3'. In order to be able to evaluate a measurement signal correlated with sensed laser light 51', the monitor diode 2' is connected by bonding wires 8' to terminal pins 9' of the laser device. A vertically emitting laser diode 1' is soldered on the monitor diode 2'. The laser diode 1' is also bonded by the bonding wires 8' to the terminal pins 9' of the laser device.

Light 5' emitted by the laser diode 1' enters an optical system, for example through a window 4' or lens system 4' of the laser device. The lens system 4' is, for example, connected to an optical fiber or another optical or optoelectronic element of the optical system. A part 51' of the light 5' emitted by the laser diode 1' is reflected or back-scattered from the window 4' or lens system 4' and sent onto the monitor diode 2'. The majority of the emitted light 5', however, is coupled into the optical system, for example into an optical fiber. In order to prevent interference with the beam path and to protect the components (for example against moisture and mechanical stresses), the laser device has a hermetically sealed housing 31'.

Figure 1:
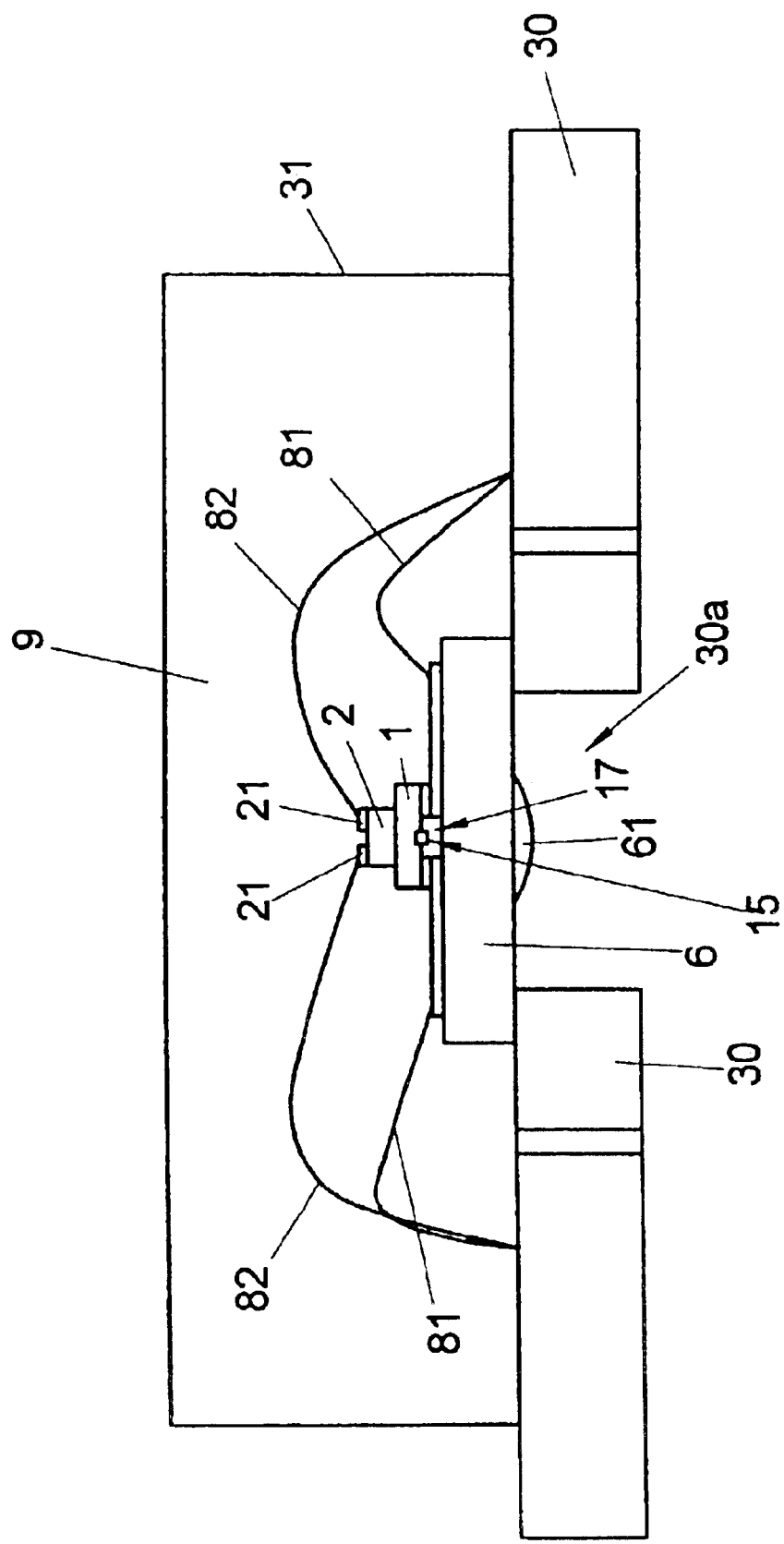
FIG. 1 is a diagrammatic, sectional view of an overall representation of a laser device according to the invention.

FIG. 1 shows a configuration of the laser device according to the invention. Non-illustrated terminal pins, which may be part of a lead frame 30, are connected by bonding wires 81, 82 to metallic conductors, connection pads or directly to electro-optical elements 1, 2. A substrate 6 is fastened on an inner region of the lead frame 30. A nontransparent potting compound 9 encases the configuration, in particular the terminal pins, the substrate 6 and the electro-optical elements 1, 2. The configuration is enclosed by a housing 31, which is optionally fully filled with the potting compound or whose external contours form the housing 31. The potting compound 9 is in this case also used for mechanical support, in particular of the lead frame 30 and its connection pins, besides protection and shielding of the components.

Figure 2:
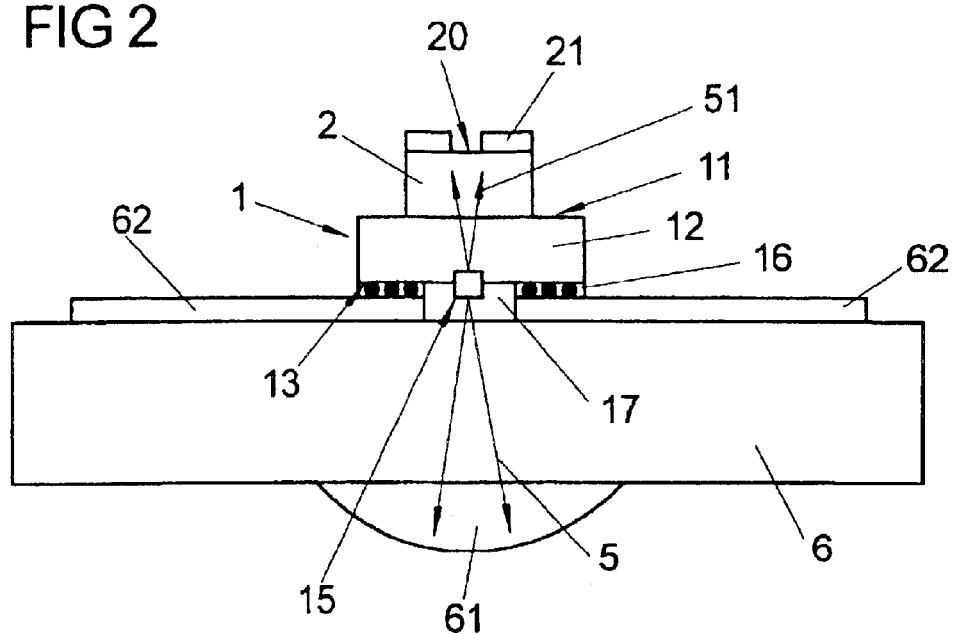
FIG. 2 is a detailed, sectional view of the laser device shown in FIG. 1.

FIG. 2 shows a schematic detail view of the laser device. Metallic interconnects 62 are structured on the substrate 6. The vertically emitting laser diode 1 is contacted on the interconnects 62 by flip chip technology. Contacts 16 of the vertically emitting laser diode 1 are to that end disposed on a side 13 of the laser diode 1 facing the substrate 6.

The contacts 16 advantageously are formed of an evaporated or sputtered and structured solder (for example AuZn).

The alignment may be carried out passively via image processing or actively by operating the laser diode 1.

Solder balls 16, so-called ball grids, which form a tolerance-insensitive metallic connection between the laser diode 1 and the interconnects 62 of the substrate 6 after soldering, may also be used as the contacts 16. The insensitivity with respect to geometrical tolerances of the positioning during fabrication permits a desired alignment of the laser diode 1 with respect to a further optical system.

The laser diode 1 naturally has a resonator 15. At an exit side of the resonator 15 of the laser diode 1, laser light 5 is emitted that has a radiation wavelength that is not absorbed, or is absorbed only insubstantially, in the substrate 6 and in a diode substrate 12, so that the beam path 5 can pass through these materials without sizeable optical losses. Such radiation wavelengths are, for instance, in the range of between 1 µm and 1.8 µm, for example equal to 1.3 µm and 1.55 µm.

The region between the substrate 6 and the resonator 15, or the diode substrate 12, is filled with plastic 17 that is transparent for the desired radiation wavelength.

Since the beam path 5 is hence insensitive to interference as far as the adjacent optical system, the housing 31 of the laser device is not necessarily configured to be hermetic. It is preferably completely filled with plastic, for example potted or encapsulated. Furthermore, the beam 5 propagates through an optically denser media than air, so that the beam path 5 is advantageously shortened and the emission divergence is reduced. The back-radiation from parts of the optical system into the vertically emitting laser diode 1 is significantly reduced.

In the exemplary embodiment being described, although not necessarily, the substrate 6 has in integrated form a part of an optical system, for example of a transmission system. The substrate 6, which in this case is formed of silicon, is represented in FIG. 2 as having an integrated lens 61 or the like, in order to converge or diverge the emerging laser radiation 5, or to couple it into a light waveguide.

The lens is particularly advantageously used in a dual function to simplify assembly of the laser diode 1, by illuminating through the substrate 6 at the position of the lens 61, from the lens side, during alignment of the laser diode 1. A light spot due to the illumination through the lens 61 is used as an alignment mark for passive alignment of the laser diode 1, so that the laser diode 1 does not necessarily need to be operated during assembly.

Furthermore, the laser diode 1 is advantageously mounted obliquely so that the back-reflection from the substrate 6 into the laser diode 1 is significantly reduced. To that end, the laser diode 1 is mounted slightly tilted with respect to the surface of the substrate 6 by using deliberate layer-thickness differences of the flip chip contacts or by using layer-thickness differences of the contacts on the laser diode 1 or on the substrate 6.

The surface of the lens 61 constitutes a light exit window of the laser device. All other regions are encased by the nontransparent plastic potting compound 9. The lead frame 30 has a hole 30a in the vicinity of the lens 61 (see FIG. 1).

The use of the structured interconnects 62 allows a layout with lower stray capacitances and stray inductances. Furthermore, the properties of the electrical connections in the radiofrequency range are significantly improved. Microstrips or coplanar lines can be integrated on the substrate. Since the laser diode 1 is disposed close to the substrate 6, the laser diode 1 can more readily dissipate the heat produced during operation with a smaller thermal resistance to the substrate 6 and to the lead frame 30, and consequently to adjoining media.

In a non-illustrated configuration, control electronics for radiofrequency control of the laser diode 1, for example by a driver, are additionally integrated in the substrate. In this way, it is possible to produce particularly short electrical lines from the driver to the laser diode 1 via the flip chip contacts 16.

The monitor diode 2 is fastened directly to the laser diode 1 by adhesive bonding. Adhesive bonding reduces the overall thermal load on the monitor diode 2 during assembly. The monitor diode 2 is optically coupled to a backside 11 of the laser diode 1, on the other side from the exit side of the resonator 15. The backside 11 also emits light 51, the power of the laser light 51 being only a fraction of the light 5 emitted into the optical system, in order to be sensed by the monitor diode 2. To that end, the monitor diode 2 has a light-sensitive face, which is disposed in the beam path 51 of the backside-emitted light 51 and advantageously adsorbs the laser light 51.

On a side 20 facing away from the laser diode 1, the monitor diode 2 has connection pads 21 for contacting using the bonding wires 82 represented in FIG. 1. Owing to this configuration of the monitor diode 2, particularly cost-effective production thereof is possible since the side of the monitor diode 2 facing the laser diode 1 does not need to be structured.

The light-sensitive face of the monitor diode 2 is preferably situated on the top side 20 of the monitor diode 2, which also contains the connection pads 21, in order to permit contacting of the light-sensitive face in a straightforward way.

In one configuration of the exemplary embodiment being described, the backside 11 of the laser diode 1 is roughened, so that back-reflections from the monitor diode 2 into the laser diode 1 are minimized.

Owing to the described compact construction of the laser device, it is possible to use small package sizes. The configuration is hence appropriate, in particular, for surface mounting (SMD technology). Furthermore, the compact configuration allows a dense configuration of a plurality of vertically emitting laser diodes 1 to 4 as a one- or two-dimensional matrix arrangement (array).

In a refinement of the invention, the compact configuration also allows self-aligning processes. In this case, solder pads on the laser diode are matched in terms of their geometry to the solder faces of the substrate, so that a mechanical tension that brings the solder pads into line is created during soldering. The self-alignment is in this case based on the physical principle that the surface tension of the solder tries to find a minimum.

In summary, advantages of the invention are that the laser device can be produced suitably in terms of volume, for example in four-inch technology, since the backside of the laser diode 1 does not need to be structured. The same applies to the monitor diode 2. A board assembly known for semiconductor chips can be used. A burn-in, as well as measurement of the optical and electrical properties of the laser diode 1, are already possible in the board or can be tested in an SMD package, so that defective parts can be rejected early on. The monitor function is favorably achieved since it is not necessary to have to use reflected radiation.

The layout is configured so that it is possible to structure both the vertically emitting laser 1 and the monitor diode 2 on only one side, so that the producibility and reproducibility of both semiconductor chips is significantly improved, since electrical contacts of the laser diode 1 and of the monitor diode 2 are respectively disposed on one side. The layout is configured so that the monitor diode 2 can be connected by long bonding wires 82, and, at the same time, the laser diode 1 can be connected favorably in terms of radiofrequency technology by the flip chip contacts 16 and merely short bonding wires 81.

We claim:

1. A laser device, comprising:

an optical system;

a laser diode having a light emitting side, a backside and an optical resonator with an exit side for emitting light into said optical system, said laser diode being structured for electrical contacting only at said light emitting side;

a substrate being transparent for an emission wavelength of said laser diode;

said laser diode being mounted with said light emitting side on said substrate using flip chip technology in an upside down layout; and a monitor diode having a light-sensitive face for measuring at least one optical quantity of said laser diode, said light-sensitive face optically coupled to said backside of said laser diode, said backside being opposite said exit side of said resonator and also emitting further light.

2. The laser device according to claim 1, wherein said backside of said laser diode is disposed directly next to said monitor diode.

3. The laser device according to claim 1, wherein said laser diode has optical reflectors, at least one of said optical reflectors assigned to said backside for optical coupling to said monitor diode and transmits a part of the further light sensed by said monitor diode.

4. The laser device according to claim 1, wherein said backside of said laser diode has an increased reflectance.

5. The laser device according to claim 1, wherein said monitor diode has a side facing away from said laser diode and is structured for electrical contacting.

6. The laser device according to claim 1, wherein said laser diode has a side facing away from said monitor diode and is structured for electrical contacting.

7. The laser device according to claim 1, wherein said optical system is integrated in said substrate, said laser diode is positioned with respect to said optical system independently of a configuration of a backside of said monitor diode.

8. The laser device according to claim 1, wherein said monitor diode is adhesively bonded onto said backside of said laser diode.

9. The laser device according to claim 1, wherein said monitor diode is monolithically integrated in said backside of said laser diode.

10. The laser device according to claim 1, further comprising a transparent plastic filling a region defined between said resonator and said substrate.

11. The laser device according to claim 1, further comprising a transparent plastic disposed between said resonator and said monitor diode.

12. The laser device according to claim 1, further comprising a nontransparent plastic one of potting and encapsulating said monitor diode, said substrate, and said laser diode.

13. The laser device according to claim 12, wherein said nontransparent plastic fully encases said laser diode, said monitor diode and said substrate, except for a light exit window.

14. The laser device according to claim 13, wherein said light exit window is formed by a subregion of said substrate.

15. The laser device according to claim 14, further comprising a lead frame, said substrate disposed on said lead frame, said lead frame having an opening formed therein in a vicinity of said light exit window.

16. The laser device according to claim 13, further comprising a housing filled with said nontransparent plastic and enclosing at least maid laser diode, said monitor diode and said substrate, except for said light exit window.

17. The laser device according to claim 13, further comprising a beam-shaping face having an external surface integrated in said substrate, and said light exit window is formed by said external surface of said beam-shaping face.

18. The laser device according to claim 1, wherein said substrate is a submount that is transparent for an emission wavelength of said laser diode.

19. The laser device according to claim 1, wherein said laser diode is a vertically emitting laser diode.

20. The laser device according to claim 1, wherein said optical system is a lens.

* * * * *